United States Patent
Niwa

(10) Patent No.: US 8,957,805 B2
(45) Date of Patent: Feb. 17, 2015

(54) BALANCED SIGNAL PROCESSING CIRCUIT AND ANALOG-DIGITAL CONVERSION CIRCUIT

(71) Applicant: Sony Corporation, Tokyo (JP)

(72) Inventor: Atsumi Niwa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/189,316

(22) Filed: Feb. 25, 2014

(65) Prior Publication Data

US 2014/0253359 A1  Sep. 11, 2014

(30) Foreign Application Priority Data

Mar. 11, 2013  (JP) .................. 2013-047632

(51) Int. Cl.
*H03M 1/12* (2006.01)
*H03K 5/007* (2006.01)

(52) U.S. Cl.
CPC ... *H03K 5/007* (2013.01); *H03M 1/12* (2013.01)
USPC ............ 341/172; 341/118; 341/155; 341/163

(58) Field of Classification Search
CPC ........... H03M 1/12; H03M 1/38; H03M 1/40; H03M 1/403; H03M 1/46; H03M 1/462; H03M 1/804

USPC .................................. 341/118, 155, 163, 172
See application file for complete search history.

(56) References Cited

U.S. PATENT DOCUMENTS 5,581,252 A * 12/1996 Thomas ................... 341/144
6,313,779 B1 * 11/2001 Leung et al. .............. 341/155
7,671,908 B2 * 3/2010 Lee .......................... 348/241
7,944,387 B2 * 5/2011 Ohnhaeuser et al. ...... 341/172

FOREIGN PATENT DOCUMENTS

JP  2010-035098  2/2010

* cited by examiner

*Primary Examiner* — Khai M Nguyen
(74) *Attorney, Agent, or Firm* — Dentons US LLP

(57) ABSTRACT

A balanced signal processing circuit includes: a comparator; a first capacitor having a first end connected to a non-inverting input terminal of the comparator; a second capacitor having a first end connected to an inverting input terminal of the comparator; a first switch configured to apply a voltage signal to the first end of the first capacitor; a second switch configured to apply a voltage signal to the first end of the second capacitor; an operation state detection section configured to detect an operation state of the comparator; and an offset voltage correction section configured to apply a predetermined offset voltage to a second end of the first capacitor and a second end of the second capacitor when the operation state detection section detects an abnormal operation state of the comparator.

6 Claims, 7 Drawing Sheets

BALANCED SIGNAL PROCESSING CIRCUIT AND ANALOG-DIGITAL CONVERSION CIRCUIT

CROSS REFERENCE TO RELATED APPLICATIONS

This application claims the benefit of Japanese Priority Patent Application JP 2013-47632 filed Mar. 11, 2013, the entire contents of which are incorporated herein by reference.

BACKGROUND

The present disclosure relates to a balanced signal processing circuit and an analog-digital conversion circuit.

Electronic apparatuses in recent years are desired to process large-volume digital data at high speed. In addition, the electronic apparatuses are desired to consume low power along with downsizing. In terms of low power consumption, low voltage driving is also desired in order to accept a battery as a power source. Such demands are applied to an analog-digital conversion circuit (hereinafter, simply referred to as "A-D conversion circuit").

FIG. 7 illustrates a balanced signal processing circuit 701 in related art.

A balanced signal is input to a complete differential amplifier 702 through a first input terminal Vin1 and a second input terminal Vin2, and is amplified in voltage. The balanced signal amplified in voltage by the complete differential amplifier 702 is applied to capacitors C104 and C105 through a first switch 102 and a second switch 103. The first switch 102 and the second switch 103 are controlled to be turned on or off by control signals based on a sampling clock (not illustrated). While the first switch 102 and the second switch 103 are closed (turned on), charge is accumulated in the capacitors C104 and C105. The capacitor C104 holds both end voltage Vs1 between a ground node and an input terminal thereof by charge, and the capacitor C105 holds both end voltage Vs2 between a ground node and an input terminal thereof by charge.

While the first switch 102 and the second switch 103 are opened (turned off), the both end voltage Vs1 of the capacitor C104 and the both end voltage Vs2 of the capacitor C105 are input to a comparator 106. The comparator 106 converts a relative potential difference between the both end voltage Vs1 of the capacitor C104 and the both end voltage Vs2 of the capacitor C105 into a logic signal, and then outputs the logic signal.

Note that the output signal of the comparator 106 may be input to, for example, a successive approximation analog-digital conversion logic circuit. In this case, the balanced signal processing circuit 701 and the successive approximation analog-digital conversion logic circuit configure a successive approximation analog-digital conversion circuit as a whole.

SUMMARY

When the balanced signal processing circuit 701 in FIG. 7 is employed in an integrated circuit, a dynamic latch comparator is employed as the comparator 106 in order to reduce consumed power. The dynamic latch comparator receives clock input. Further, the comparator of this kind has an operation voltage range of an input signal. If the voltage of the input signal is out of the operation voltage range, normal operation of the comparator is not expected. Therefore, in related art, an amplifier is inserted in the preceding stage of the comparator to adjust the bias voltage of the input signal so that the voltage of the input signal is within the operation voltage range. The amplifier is the complete differential amplifier 702 in FIG. 7.

However, adjusting the bias voltage of the input signal by the amplifier causes occurrence of a steady current in the amplifier and increase in power consumption. The presence of the steady current inhibits decrease in power consumption in mobile electronic apparatuses. It is necessary to increase the battery size in order to compensate power consumption by the steady current, which inhibits weight reduction of the device and deteriorates portability.

It is desirable to provide a balanced signal processing circuit and an analog-digital conversion circuit that substantially eliminate a steady current to achieve low power consumption.

According to an embodiment of the technology, there is provided a balanced signal processing circuit including: a comparator; a first capacitor having a first end connected to a non-inverting input terminal of the comparator; a second capacitor having a first end connected to an inverting input terminal of the comparator; a first switch configured to apply a voltage signal to the first end of the first capacitor; a second switch configured to apply a voltage signal to the first end of the second capacitor; an operation state detection section configured to detect an operation state of the comparator; and an offset voltage correction section configured to apply a predetermined offset voltage to a second end of the first capacitor and a second end of the second capacitor when the operation state detection section detects an abnormal operation state of the comparator.

According to an embodiment of the technology, there is provided an analog-digital conversion circuit including: a comparator; a first capacitor having a first end connected to a non-inverting input terminal of the comparator; a second capacitor having a first end connected to an inverting input terminal of the comparator; a third capacitor having a first end connected to the non-inverting input terminal of the comparator; a fourth capacitor having a first end connected to the inverting input terminal of the comparator; a first switch configured to apply a voltage signal to the first end of the first capacitor and the first end of the third capacitor; a second switch configured to apply a voltage signal to the first end of the second capacitor and the first end of the fourth capacitor; an offset voltage correction section configured to apply a predetermined offset voltage to a second end of the first capacitor and a second end of the second capacitor when detecting an abnormal operation state of the comparator; and an analog-digital conversion logic circuit configured to control a second end of the third capacitor and a second end of the fourth capacitor to output a digital value in a state where the offset voltage correction section applies the offset voltage to the first capacitor and the second capacitor.

According to the respective embodiments of the disclosure, it is possible to provide the balanced signal processing circuit and the analog-digital conversion circuit that substantially eliminate a steady current to achieve low power consumption.

Issues, configurations, and effects other than those described above will be made clear in the following description.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION (First Embodiment: Balanced Signal Processing Circuit)

Figure 1:
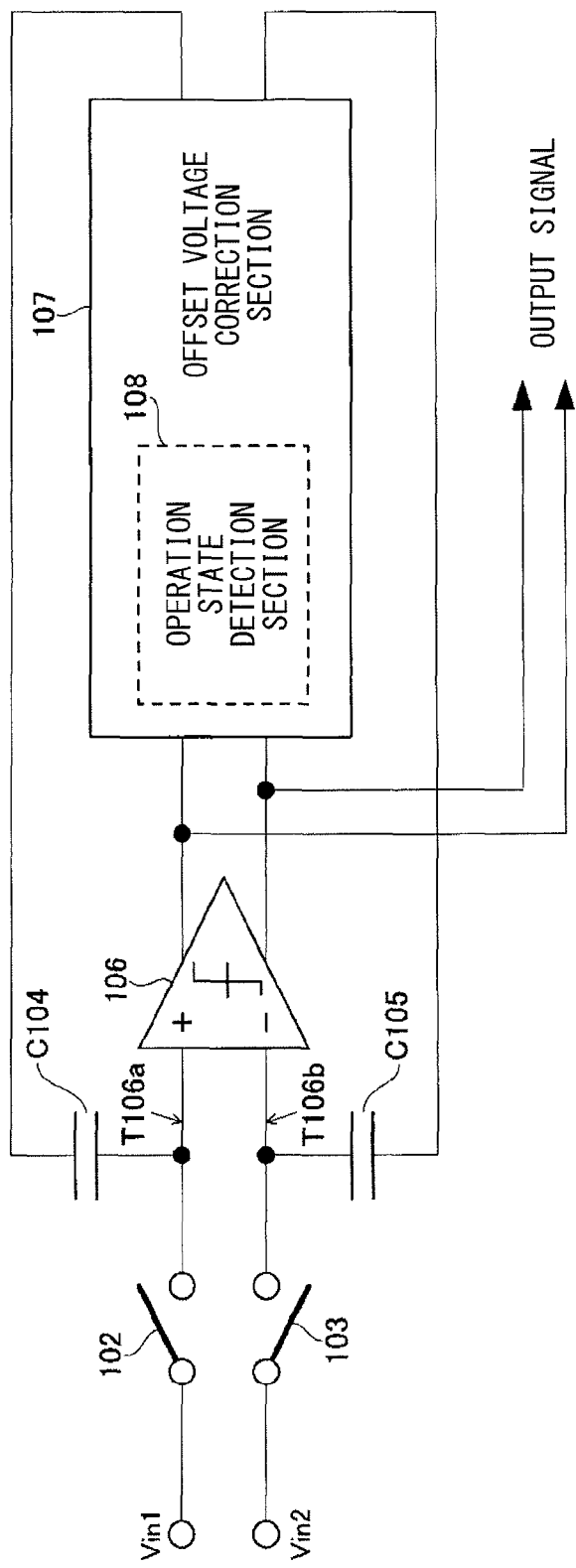
FIG. 1 is a block diagram of a balanced signal processing circuit according to a first embodiment of the disclosure.

FIG. 1 is a block diagram of a balanced signal processing circuit 101 according to a first embodiment of the disclosure.

A balanced signal is input to a first input terminal Vin1 and a second input terminal Vin2.

The first input terminal Vin1 is connected to a first end of a capacitor C104 (an example of a first capacitor) and a non-inverting input terminal T106a of a comparator 106 through a first switch 102.

The second input terminal Vin2 is connected to a first end of a capacitor C105 (an example of a second capacitor) and an inverting input terminal T106b of the comparator 106 through a second switch 103.

A second end of each of the capacitors C104 and C105 is connected to an offset voltage correction section 107.

Output signals from the comparator 106 are supplied to arbitrary circuits such as a successive approximation circuit of a successive approximation A-D conversion circuit.

The offset voltage correction section 107 is connected to output terminals of the comparator 106, and applies a predetermined voltage to the second end of each of the capacitors C104 and C105. The offset voltage correction section 107 includes an operation state detection section 108 therein.

The operation state detection section 108 monitors, based on a logic state of the output terminals of the comparator 106, the operation state of the comparator 106 to detect whether the comparator 106 operates normally. When the operation state detection section 108 detects that the comparator 106 does not operate normally, the offset voltage correction section 107 increases the voltage of the second end of each of the capacitors C104 and C105 from a ground potential to a predetermined potential.

The offset voltage correction section 107 increases the terminal voltages of the capacitors C104 and C105 from the ground potential until the operation state detection section 108 does not detect abnormal operation of the comparator 106.

The offset voltage correction section 107 may increase the terminal voltages of the capacitors C104 and C105 from the ground potential in an arbitrary manner. A D-A conversion circuit may be used, or a capacitor may be divided into a plurality of capacitors illustrated in FIG. 2 and subsequent figures and a power supply voltage may be individually applied.

Figure 2:
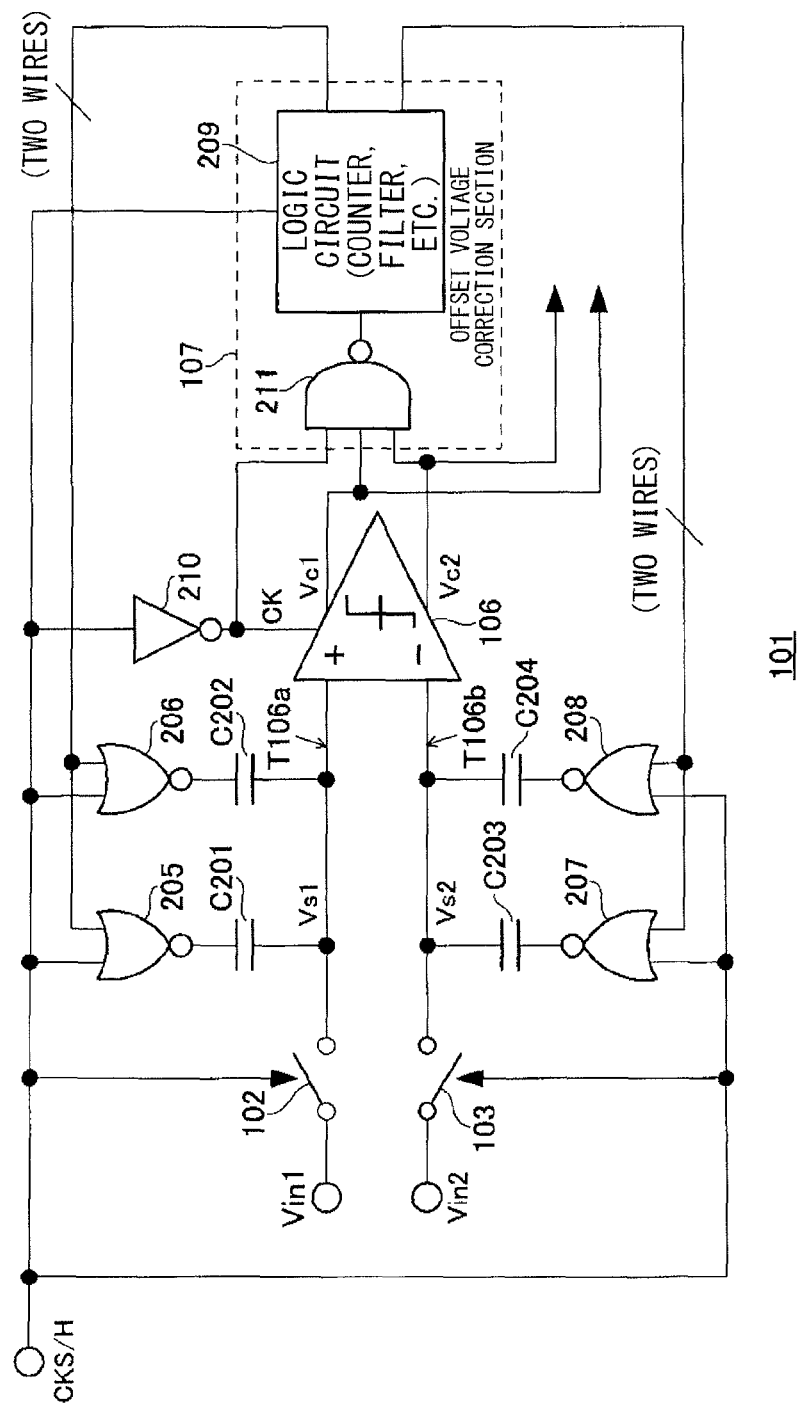
FIG. 2 is a circuit diagram of the balanced signal processing circuit according to the first embodiment of the disclosure.

FIG. 2 is a circuit diagram of the balanced signal processing circuit 101 according to the first embodiment of the disclosure.

The first input terminal Vin1 is connected to a first end of each of capacitors C201 and C202 and the non-inverting input terminal T106a of the comparator 106 through the first switch 102. The synthesized capacity of the capacitors C201 and C202 corresponds to the capacitor C104 in FIG. 1.

The second input terminal Vin2 is connected to a first end of each of capacitors C203 and C204 and the inverting input terminal T106b of the comparator 106 through the second switch 103. The synthesized capacity of the capacitors C203 and C204 corresponds to the capacitor C105 in FIG. 1.

A second end of the capacitor C201 is connected to an output terminal of a first NOR gate 205. Likewise, a second end of the capacitor C202 is connected to an output terminal of a second NOR gate 206. A second end of the capacitor C203 is connected to an output terminal of a third NOR gate 207. A second end of the capacitor C204 is connected to an output terminal of a fourth NOR gate 208.

A first input terminal of each of the first NOR gate 205, the second NOR gate 206, the third NOR gate 207, and the fourth NOR gate 208 is supplied with a sampling clock signal CKS/H.

A second input terminal of each of the first NOR gate 205, the second NOR gate 206, the third NOR gate 207, and the fourth NOR gate 208 is connected to a logic circuit 209 in the offset voltage correction section 107.

The comparator 106 is a dynamic latch comparator that compares a voltage caused by charge accumulated in the synthesized capacity of the capacitors C201 and C202 and a voltage caused by charge accumulated in the synthesized capacity of the capacitors C203 and C204, to output a logical signal of a comparison result to a first output terminal and a second output terminal. At this time, the comparator 106 receives a signal (hereinafter, referred to as "inverted clock signal CK") that is obtained by inverting the sampling clock signal CKS/H by a NOT gate 210, and performs voltage comparison operation when the inverted clock signal CK is at "true" (high potential) of the logic.

The comparator 106 is now described.

Figure 3:
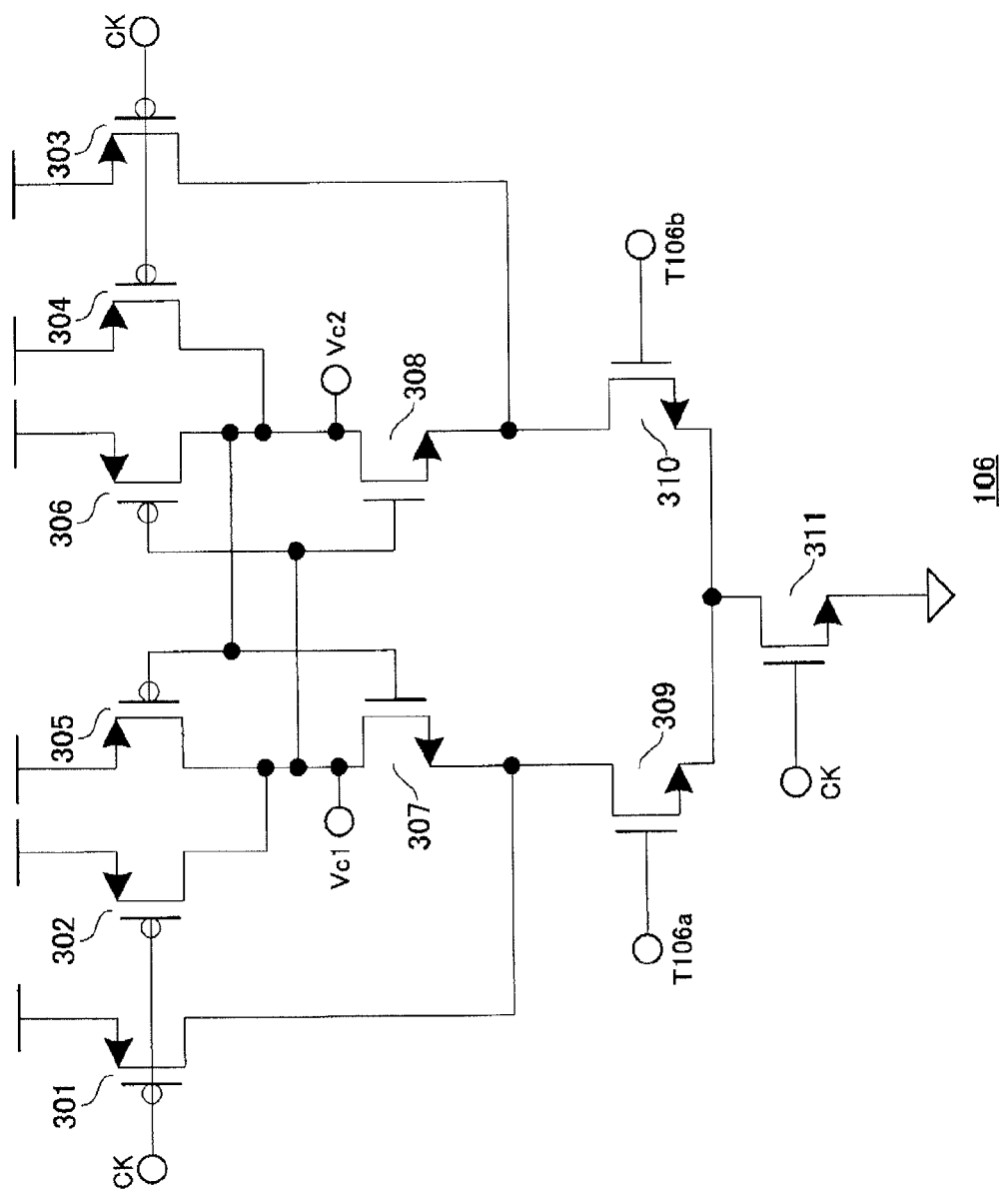
FIG. 3 is a circuit diagram of a comparator.

FIG. 3 is a circuit diagram of the comparator 106. Note that, hereinafter, N-channel MOSFET is simply referred to as NMOSFET, and P-channel MOSFET is simply referred to as PMOSFET.

A source of each of a PMOSFET 301, a PMOSFET 302, a PMOSFET 303, a PMOSFET 304, a PMOSFET 305, and a PMOSFET 306 is connected to a power source node.

A gate of the PMOSFET 301 and a gate of the PMOSFET 302 are connected, and are supplied with the inverted clock signal CK.

A gate of the PMOSFET 303 and a gate of the PMOSFET 304 are connected, and are supplied with the inverted clock signal CK.

A drain of the PMOSFET 305 is connected to a drain of the PMOSFET 302.

A drain of the PMOSFET 306 is connected to a drain of the PMOSFET 304.

In addition, the drain of the PMOSFET 305 and the drain of the PMOSFET 302 are connected to a drain of an NMOSFET 307. The connection point therebetween is defined as a first output terminal Vc1.

Moreover, the drain of the PMOSFET 306 and the drain of the PMOSFET 304 are connected to a drain of an NMOSFET 308. The connection point therebetween is defined as a second output terminal Vc2.

A gate of the NMOSFET 307 is connected to a gate of the PMOSFET 305 and the drain of the PMOSFET 306.

A gate of the NMOSFET 308 is connected to a gate of the PMOSFET 306 and the drain of the PMOSFET 305.

A drain of the PMOSFET 301 is connected to a drain of an NMOSFET 309 and a source of the NMOSFET 307. A gate of the NMOSFET 309 is defined as the non-inverting input terminal T106a.

A drain of the PMMOSFET 303 is connected to a drain of an NMOSFET 310 and a source of the NMOSFET 308. A gate of the NMOSFET 310 is defined as the inverting input terminal T106b. Incidentally, as is obvious from the circuit in FIG. 3, since the circuit of the comparator 106 is wholly symmetric, either the gate of the NMOSFET 309 or the gate of the NMOSFET 310 may be the non-inverting input terminal T106a, or may be the inverting input terminal T106b. In the case where the non-inverting input terminal T106a and the inverting input terminal T106b are reversed, the first output terminal Vc1 and the second output terminal Vc2 are also reversed.

A source of the NMOSFET 309 and a source of the NMOSFET 310 are connected to a drain of an NMOSFET 311. A gate of an NMOSFET 311 is supplied with the inverted clock signal CK. A source of the NMOSFET 311 is connected to a ground node.

When the inverted clock signal CK becomes "false" of the logic, namely, becomes a low potential, the PMOSFET 301, the PMOSFET 302, the PMOSFET 303, and the PMOSFET 304 are turned on, and operation of comparing the potential difference between the non-inverting input terminal T106a and the inverting input terminal T106b is not performed. At this time, the NMOSFET 311 is in an off state.

In contrast, when the inverted clock signal CK becomes "true" of the logic, namely, becomes a high potential, the PMOSFET 301, the PMOSFET 302, the PMOSFET 303, and the PMOSFET 304 are turned off, and the operation of comparing the potential difference between the non-inverting input terminal T106a and the inverting input terminal T106b is performed. At this time, the NMOSFET 311 is in an on state.

Therefore, in the comparator 106, a steady current flowing from the power source node to the ground node does not occur.

The PMOSFET 305, the PMOSFET 306, the NMOSFET 307, and the NMOSFET 308 each have a circuit structure equivalent to an SRAM cell. The potential differences based on the input voltages are applied to the circuit structures by the NMOSFET 309 and the NMOSFET 310. As a result, a logic signal as a result of comparing the potential difference of the input signal is output to the first output terminal Vc1 and the second output terminal Vc2.

The on state is not established between the drain and the source of the MOSFET until the gate-source voltage is increased to a voltage of a certain level. The voltage of the certain level is called "threshold voltage" or "ON voltage". In the case of the comparator 106 of FIG. 3, the NMOSFET 309 and the NMOSFET 310 are each configured of an NMOSFET. Therefore, when voltages of the signals input to the gates of the NMOSFET 309 and the NMOSFET 311 are both lower than the ON voltage, the comparison of the voltages is not normally performed.

If the voltages applied to the gates of the NMOSFET 309 and the NMOSFET 310 are both lower than the drain-source voltage of the NMOSFET 311, the comparator 106 does not normally operate. Therefore, a high potential is output from both of the first output terminal Vc1 and the second output terminal Vc2.

The circuit of the balanced signal processing circuit 101 is described once again return to FIG. 2.

The outputs from the first output terminal Vc1 and the second output terminal Vc2 of the comparator 106 are input together with the inverted clock signal CK to the NAND gate 211. The NAND gate 211 corresponds to the operation state detection section 108 in FIG. 1. In other words, when the inverted clock signal CK is "true" of the logic and the outputs from both the first output terminal Vc1 and the second output terminal Vc2 are "true" of the logic, the NAND gate 211 outputs "false" of the logic.

The output signal of the NAND gate 211 is supplied to the logic circuit 209. The logic circuit 209 receives the output signal of the NAND gate 211 to output the logic signal to a second input terminal of each of the first NOR gate 205, the second NOR gate 206, the third NOR gate 207, and the fourth NOR gate 208.

First, in an initial state, the logic circuit 209 outputs "true" of the logic to the second input terminal of each of the first NOR gate 205, the second NOR gate 206, the third NOR gate 207, and the fourth NOR gate 208. Then, the first NOR gate 205, the second NOR gate 206, the third NOR gate 207, and the fourth NOR gate 208 each output "false" of the logic, namely, output a low potential (ground potential). The capacitor C201 connected to the first NOR gate 205, the capacitor C202 connected to the second NOR gate 206, the capacitor C203 connected to the third NOR gate 207, and the capacitor C204 connected to the fourth NOR gate 208 are all connected to the ground node.

When the clock signal is "true" of the logic (sampling period), the first NOR gate 205, the second NOR gate 206, the third NOR gate 207, and the fourth NOR gate 208 all output "false" of the logic. Therefore, the capacitors C201 and C202 are connected between the ground node and the first input terminal Vin1 and receive the voltage of the first input terminal Vin1, and thus charge is accumulated in the capacitors C201 and C202. Likewise, the capacitors C203 and C204 are connected between the ground node and the second input terminal Vin2 and receive the voltage of the second input terminal Vin2, and thus charge is accumulated the capacitors C203 and C204.

Next, when the clock signal is "false" of the logic (hold period), the first NOR gate 205, the second NOR gate 206, the third NOR gate 207, and the fourth NOR gate 208 all output "false" of the logic. Therefore, the comparator 106 compares the potential difference between the inter-terminal voltage obtained from the synthesized capacity of the capacitors C201 and C202 that are connected to the non-inverting input terminal T106a and the inter-terminal voltage obtained from the synthesized capacity of the capacitors C203 and C204 that are connected to the inverting input terminal T106b, to output a logical value of the result.

As described above with reference to FIG. 3, when the voltages of the input signals are both lower than the ON voltage of the NMOSFET 309 and the NMOSFET 310 in the comparator 106, the comparator 106 does not normally operate, and the high potential is output from both the first output terminal Vc1 and the second output terminal Vc2. Specifically, at the time of holding (when the clock signal is "false" of the logic), since the inverted clock signal CK is "true" of the logic, the NAND gate 211 outputs "false" of the logic.

When the comparator 106 operates during the hold period, and if the NAND gate 211 outputs "false" of the logic, it represents that the comparator 106 operates abnormally. The abnormal operation of the comparator 106 indicates failure of the voltage comparison operation during the period. Therefore, the logic circuit 209 outputs "true" of the logic to the second input terminal of each of the first NOR gate 205 and the third NOR gate 207. Then, during a hold period subsequent to the next sampling period, the first NOR gate 205 and the third NOR gate 207 output "true" of the logic. Further, the capacitor C201 connected to the first NOR gate 205 and the capacitor C203 connected to the third NOR gate 207 are supplied with the power source voltage.

At this time, the voltages applied to the non-inverting input terminal T106$a$ and the inverting input terminal T106$b$ of the comparator 106 are represented by the following expressions.

$$Vs1' = Vs1 + \frac{C201}{C201 + C202} VDD$$ [Numerical Expression 1]
$$Vs2' = Vs2 + \frac{C203}{C203 + C204} VDD$$

Therefore, the voltage of the non-inverting input terminal T106$a$ becomes Vs1' that is the original both end voltage Vs1 of the capacitors C201 and C202 added with the offset voltage, and the voltage of the inverting input terminal T106$b$ becomes Vs2' that is the original both end voltage Vs2 of the capacitors C203 and C204 added with the offset voltage. Since the offset voltage is added, when one of the voltages Vs1' and the Vs2' exceeds the ON voltage of the NMOSFET 309 and the NMOSFET 310, the comparator 106 normally operates.

If the comparator 106 operates abnormally even when "true" of the logic is output to the first NOR gate 205 and the third NOR gate 207, it is only necessary for the logic circuit 209 to further output "true" of the logic to the second NOR gate 206 and the fourth NOR gate 208. As a result, the power source voltage VDD is applied as the offset voltage to the both end voltages Vs1 and Vs2.

In the case where the adjustment of the offset voltage is desired to be finely controlled, it is only necessary to increase the number of capacitors and the number of NOR gates. In addition, forming the capacity ratio of the capacitors in relation with the square of 2 such as 1:2:4:8:16 . . . enables effective adjustment of the offset voltage with the less number of NOR gates.

Figure 4:
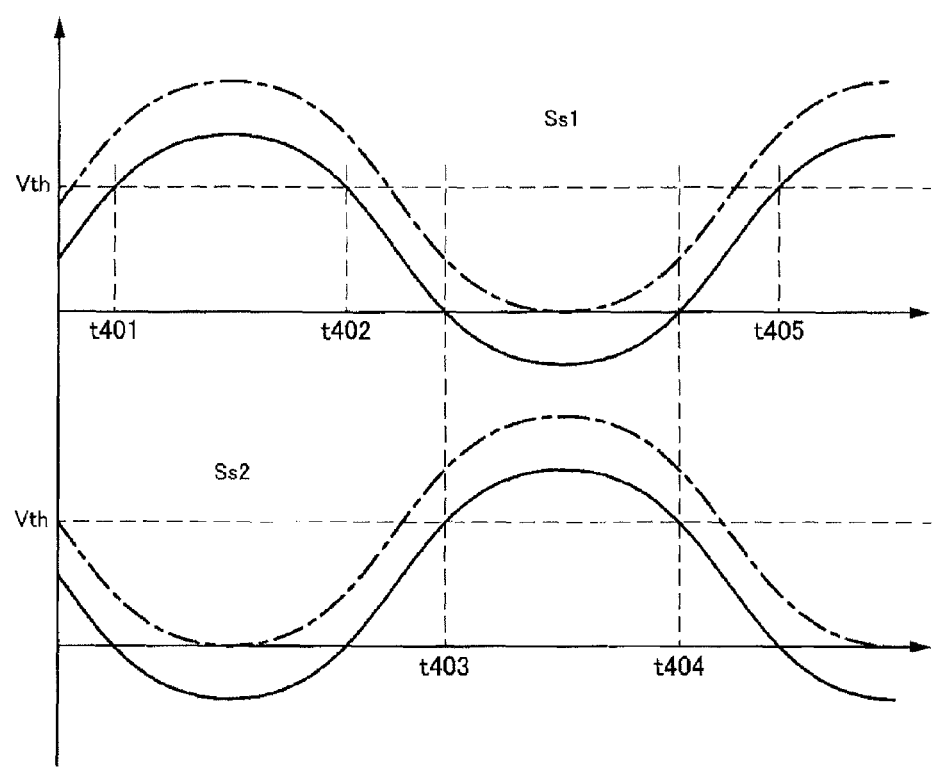
FIG. 4 is a schematic diagram illustrating an example of signals input to the comparator.

FIG. 4 is a schematic diagram illustrating an example of signals input to the comparator 106.

A signal Ss1 that is input to the non-inverting input terminal T106$a$ of the comparator 106 and has the both end voltage Vs1 and a signal Ss2 that is input to the inverting input terminal T106$b$ of the comparator 106 and has the both end voltage Vs2 are lower than the ON voltage Vth in some cases.

In FIG. 4, during a period from a time point t402 to a time point t403 and during a period from a time point t404 to a time point t405, both of the signal Ss1 and the signal Ss2 are lower than the ON voltage Vth. Therefore during these periods, the comparator 106 operates abnormally.

Therefore, when the power source voltage Vdd is applied to the capacitors C201 and C203, the offset voltage is applied to both the signal Ss1 and the signal Ss2. The offset voltage prevents both of the signal Ss1 and the signal Ss2 from being lower than the ON voltage Vth during the period from the time point t402 to the time point t403 and during the period from the time point t404 to the time point t405, which prevents the comparator 106 from operating abnormally.

(Second Embodiment: Successive Approximation A-D Conversion Circuit)

Figure 5:
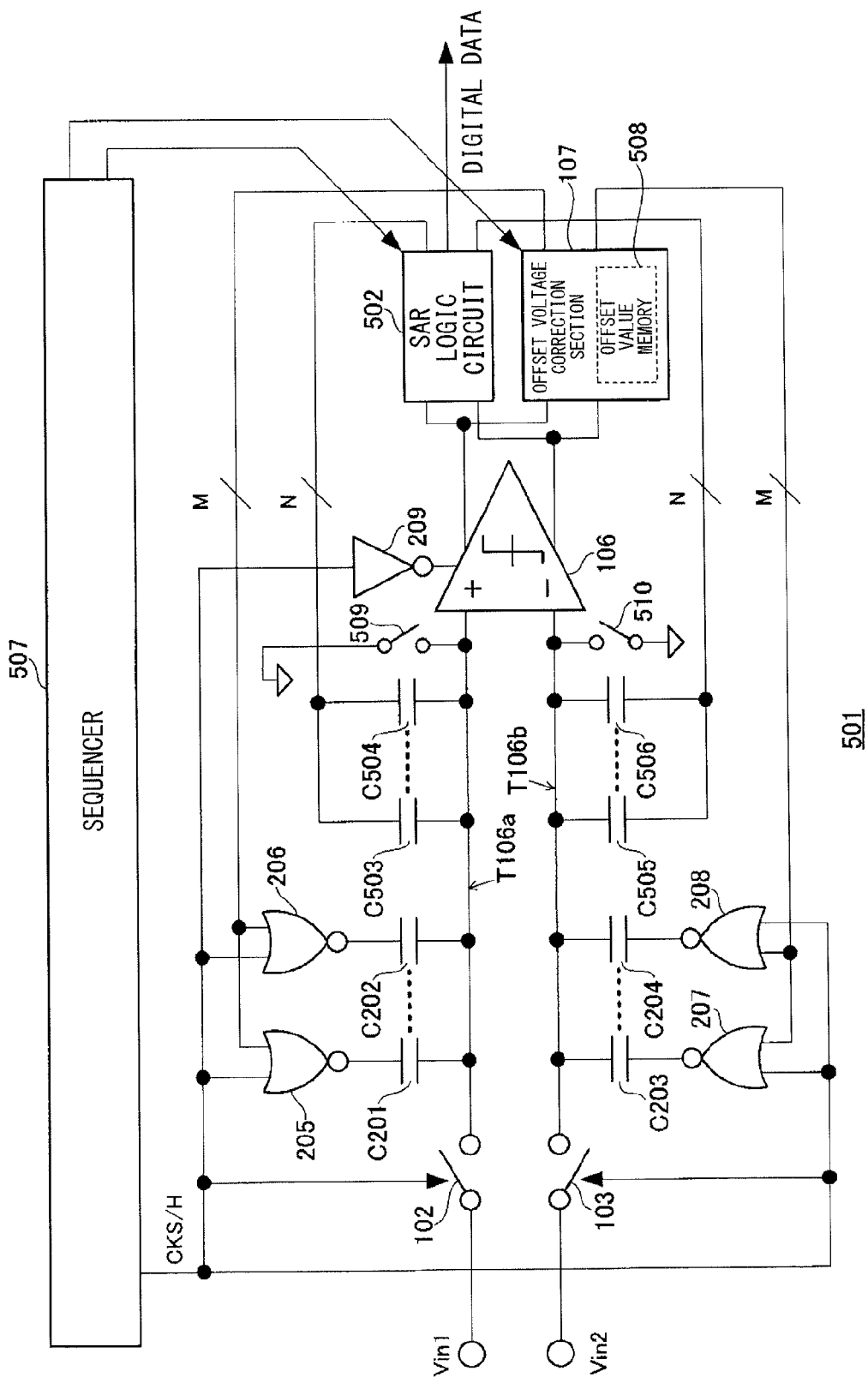
FIG. 5 is a circuit diagram of a successive approximation A-D conversion circuit according to a second embodiment of the disclosure.

FIG. 5 is a circuit diagram of an A-D conversion circuit 501 according to a second embodiment of the disclosure.

The A-D conversion circuit 501 illustrated in FIG. 5 is different from the balanced signal processing circuit 101 of FIG. 2 in that a successive approximation register logic circuit (hereinafter, simply referred to as "SAR logic circuit") 502, capacitors C503, C504, C505, and C506 that are connected to the SAR logic circuit 502, and a sequencer 507 that controls the circuit and the capacitors and outputs the sampling clock signal CKS/H and the like are added.

Specifically, when the SAR logic circuit 502 performs successive approximation A-D conversion processing, the offset voltage correction section 107, the first NOR gate 205, the second NOR gate 206, the third NOR gate 207, and the fourth NOR gate 208 that are connected to the offset voltage correction section 107, and the capacitors C201, C202, C203, and C204 that are connected to the NOR gates 205 to 208 apply the offset voltage to the non-inverting input terminal T106$a$ and the inverting input terminal T106$b$ of the comparator 106.

The offset voltage correction section 107 stores, in the offset value memory 508 provided therein, data of the NOR gates that apply the offset voltage.

The third switch 509 is inserted between the non-inverting input terminal T106$a$ of the comparator 106 and the ground node. The third switch 509 is turned on by the sequencer 507 immediately before the sampling period to discharge the charge accumulated in the capacitors C201, C202, C503, and C504.

The fourth switch 510 is inserted between the inverting input terminal T106$b$ of the comparator 106 and the ground node. The fourth switch 510 is turned on by the sequencer 507 immediately before the sampling period to discharge the charge accumulated in the capacitors C203, C204, C505, and C506.

Note that the number of capacitors C201 and C202 and the number of capacitors C203 and C204 are increased together with the NOR gates as necessary.

Likewise, the number of the capacitors C503 and C504 and the number of capacitors C505 and C506 are increased according to requested specifications of the SAR logic circuit 502.

The number of capacitors illustrated in FIG. 5 is suppressed to minimum for simplification of description.

Figure 6:
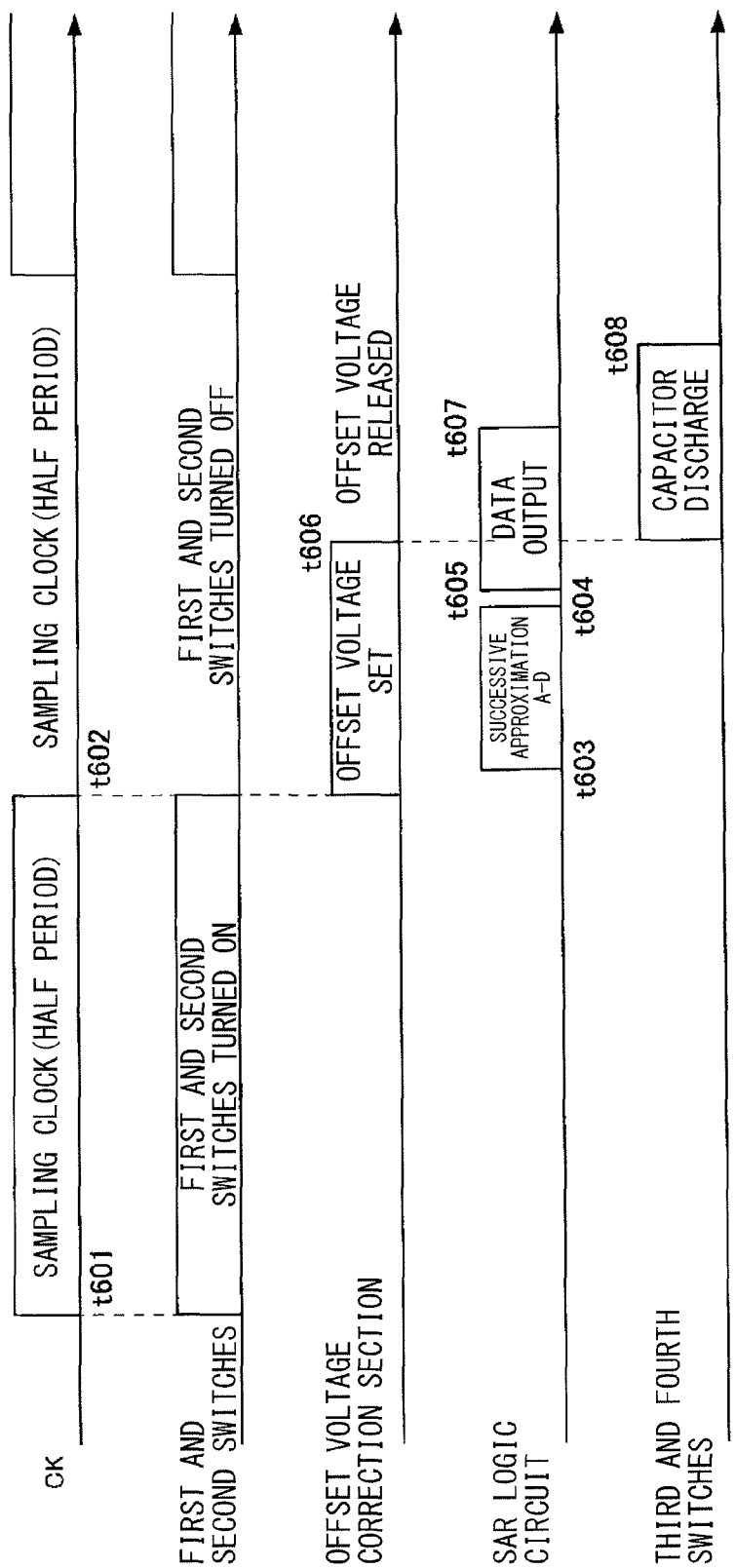
FIG. 6 is a time chart of the successive approximation A-D conversion circuit.
Figure 7:
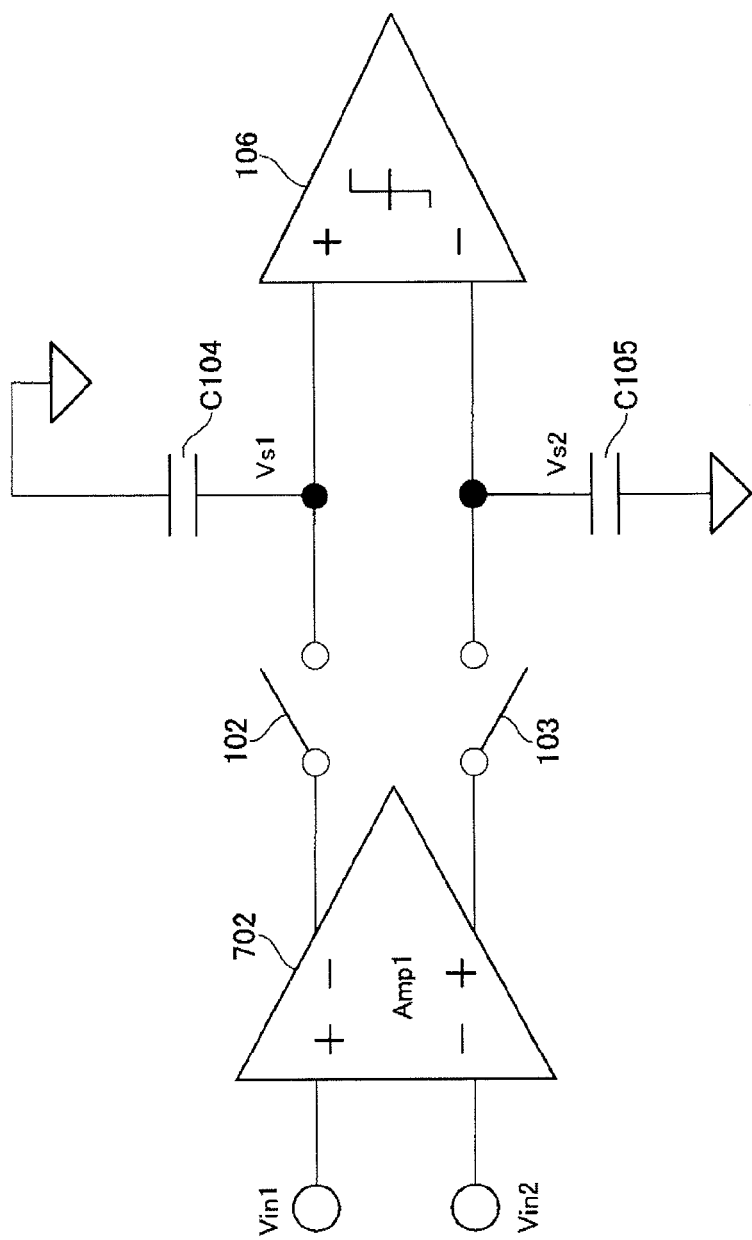
FIG. 7 is a circuit diagram of a balanced signal processing circuit in related art.

FIG. 6 is a time chart of the A-D conversion circuit 501.

While the sampling clock outputs "true" of the logic (from t601 to t602), the first switch 102 and the second switch 103 are turned on. Then, the capacitors C201, C202, C203, C204 and the capacitors C503, C504, C505, and C506 are charged.

Next, when the sampling clock changes to "false" of the logic (from t602), the offset voltage correction section 107 responds to the control signal output from the sequencer 507, and controls the first NOR gate 205, the second NOR gate 206, the third NOR gate 207, and the fourth NOR gate 208, based on the data held in the offset value memory 508. Then, out of the capacitors C201, C202, C203, and C204, the capacitor selected by the data held in the offset value memory 508 is supplied with the power source voltage. As a result, the offset voltage is applied to the non-inverting input terminal T106$a$ and the inverting input terminal T106$b$ of the comparator 106 (from t602 to t606).

Next, in a state where the offset voltage is applied to the non-inverting input terminal T106$a$ and the inverting input terminal T106$b$ of the comparator 106, the SAR logic circuit 502 responds to the control signal output from the sequencer 507, and performs the successive approximation A-D conversion processing (from t603 to t604).

After completion of the successive approximation A-D conversion processing, the SAR logic circuit 502 outputs data that is obtained by converting a relative potential difference of the input signal into a digital value (from t605 to t607).

The role of the offset voltage correction section 107 is over when the SAR logic circuit 502 outputs data. Therefore, the offset voltage correction section 107 responds to the control signal output from the sequencer 507, and releases the setting of the offset voltage. In addition, the sequencer 507 turns on the third switch 509 and the fourth switch 510. Then, the charges accumulated in the capacitors C201, C202, C203, C204, C503, C504, C505, and C506 are discharged to the ground node (from t606 to t608). After that, the third switch 509 and the fourth switch 510 are turned off by the sequencer 507 (t608), and wait a next sampling clock.

The operation of the A-D conversion circuit 501 described in FIG. 6 is a flow of the operation at the time of steady operation of the A-D conversion circuit 501. At the time when the device in which the A-D conversion circuit 501 is incorporated is initiated, a test signal previously prepared is provided to the A-D conversion circuit 501 to activate the offset voltage correction section 107. Then, setting of the offset voltage to be applied to the comparator 106, namely, a capacitor to be operated is selected from the capacitors C201, C202, C203 and C204, and the setting information is stored in the offset value memory 508.

In the present embodiment, the balanced signal processing circuit and the analog-digital conversion circuit are disclosed.

To allow the voltage of the input signal to exceed the ON voltage of the dynamic latch comparator, after sampling to the capacitor, the potential of the terminal on a side connected to the ground node, of the capacitor that has sampled the charge is increased. This realizes the successive approximation analog-digital conversion circuit without generating the steady current at low power consumption.

Hereinbefore, although the embodiment example of the present disclosure has been described, the present disclosure is not limited to the above-described embodiment example, and various modifications and application examples may be included without departing from the scope of the present disclosure described in the appended claims or the equivalents thereof.

For example, the above-described embodiment example is for specifically describing the configurations of the device and the system in detail for facilitating understanding, and the device and the system are not necessarily limited to those including all of the described configurations. Moreover, a part of the configuration of a certain example may be replaced with the configuration of another example, and further the configuration of a certain example may be added with the configuration of another example. In addition, a part of the configuration of the above-described embodiment example may be added with the other configurations, may be removed, or may be replaced with the other configurations.

Moreover, the above-described respective configurations, functions, processing sections, etc. may be partially or entirely realized by hardware through, for example, designing by integrated circuits. Further, the above-described respective configurations, functions, etc. may be realized in such a manner that a processor interprets programs realizing the respective functions and software executes the programs. Information such as programs, tables, and files to realize the respective functions may be held in non-volatile or volatile storage such as a memory, a hard disk, and a solid state drive (SSD), or recording media such as an IC card and an optical disc.

Furthermore, the control lines and the information lines illustrated are considered necessary for description, and not all control lines and information lines on a product are necessarily illustrated. It may be considered that substantially all configurations are mutually connected in actual.

Note that the present disclosure may be configured as follows.

(1) A balanced signal processing circuit including:
a comparator;
a first capacitor having a first end connected to a non-inverting input terminal of the comparator;
a second capacitor having a first end connected to an inverting input terminal of the comparator;
a first switch configured to apply a voltage signal to the first end of the first capacitor;
a second switch configured to apply a voltage signal to the first end of the second capacitor;
an operation state detection section configured to detect an operation state of the comparator; and
an offset voltage correction section configured to apply a predetermined offset voltage to a second end of the first capacitor and a second end of the second capacitor when the operation state detection section detects an abnormal operation state of the comparator.

(2) The balanced signal processing circuit according to (1), wherein
the comparator is a dynamic latch comparator,
the first switch, the second switch, and the comparator are controlled by control signals, the control signals having an operation timing common to one another, and
the offset voltage correction section connects the second end of the first capacitor and the second end of the second capacitor to a ground node when the first switch and the second switch are turned on, and applies the offset voltage to the second end of the first capacitor and the second end of the second capacitor when the first switch and the second switch are turned off.

(3) The balanced signal processing circuit according to (2), wherein
the first capacitor includes a plurality of capacitors, each of the plurality of capacitors having a first end connected to the non-inverting input terminal of the comparator, and
the offset voltage correction section applies a predetermined voltage to a second end of a capacitor selected from the plurality of capacitors.

(4) An analog-digital conversion circuit including:
a comparator;
a first capacitor having a first end connected to a non-inverting input terminal of the comparator;
a second capacitor having a first end connected to an inverting input terminal of the comparator;
a third capacitor having a first end connected to the non-inverting input terminal of the comparator;
a fourth capacitor having a first end connected to the inverting input terminal of the comparator;
a first switch configured to apply a voltage signal to the first end of the first capacitor and the first end of the third capacitor;
a second switch configured to apply a voltage signal to the first end of the second capacitor and the first end of the fourth capacitor;
an offset voltage correction section configured to apply a predetermined offset voltage to a second end of the first capacitor and a second end of the second capacitor when detecting an abnormal operation state of the comparator; and
an analog-digital conversion logic circuit configured to control a second end of the third capacitor and a second end of the fourth capacitor to output a digital value in a state where the offset voltage correction section applies the offset voltage to the first capacitor and the second capacitor.

(5) The analog-digital conversion circuit according to (4), wherein the comparator is a dynamic latch comparator, the first switch, the second switch, and the comparator are controlled by control signals, the control signals having an operation timing common to one another, and the offset voltage correction section connects the second end of the first capacitor and the second end of the second capacitor to a ground node when the first switch and the second switch are turned on, and applies the offset voltage to the second end of the first capacitor and the second end of the second capacitor when the first switch and the second switch are turned off.

(6) The analog-digital conversion circuit according to (5), wherein the first capacitor and the third capacitor each include a plurality of capacitors each having a first end connected to the non-inverting input terminal, and the second capacitor and the fourth capacitor each include a plurality of capacitors each having a first end connected to the inverting input terminal, the offset voltage correction section applies a predetermined voltage to a second end of a capacitor selected from the plurality of capacitors included in the first capacitor and to a second end of a capacitor selected from the plurality of capacitors included in the second capacitor, and the analog-digital conversion logic circuit controls a connection state of the plurality of capacitors included in the third capacitor and a connection state of the plurality of capacitors included in the fourth capacitor, to determine a digital value to be output.

It should be understood by those skilled in the art that various modifications, combinations, sub-combinations, and alterations may occur depending on design requirements and other factors insofar as they are within the scope of the appended claims or the equivalents thereof.

What is claimed is:

1. A balanced signal processing circuit comprising:
   a comparator;
   a first capacitor having a first end connected to a non-inverting input terminal of the comparator;
   a second capacitor having a first end connected to an inverting input terminal of the comparator;
   a first switch configured to apply a voltage signal to the first end of the first capacitor;
   a second switch configured to apply a voltage signal to the first end of the second capacitor;
   an operation state detection section configured to detect an operation state of the comparator; and
   an offset voltage correction section configured to apply a predetermined offset voltage to a second end of the first capacitor and a second end of the second capacitor when the operation state detection section detects an abnormal operation state of the comparator.

2. The balanced signal processing circuit according to claim 1, wherein
   the comparator is a dynamic latch comparator,
   the first switch, the second switch, and the comparator are controlled by control signals, the control signals having an operation timing common to one another, and
   the offset voltage correction section connects the second end of the first capacitor and the second end of the second capacitor to a ground node when the first switch and the second switch are turned on, and applies the offset voltage to the second end of the first capacitor and the second end of the second capacitor when the first switch and the second switch are turned off.

3. The balanced signal processing circuit according to claim 2, wherein
   the first capacitor includes a plurality of capacitors, each of the plurality of capacitors having a first end connected to the non-inverting input terminal of the comparator, and
   the offset voltage correction section applies a predetermined voltage to a second end of a capacitor selected from the plurality of capacitors.

4. An analog-digital conversion circuit comprising:
   a comparator;
   a first capacitor having a first end connected to a non-inverting input terminal of the comparator;
   a second capacitor having a first end connected to an inverting input terminal of the comparator;
   a third capacitor having a first end connected to the non-inverting input terminal of the comparator;
   a fourth capacitor having a first end connected to the inverting input terminal of the comparator;
   a first switch configured to apply a voltage signal to the first end of the first capacitor and the first end of the third capacitor;
   a second switch configured to apply a voltage signal to the first end of the second capacitor and the first end of the fourth capacitor;
   an offset voltage correction section configured to apply a predetermined offset voltage to a second end of the first capacitor and a second end of the second capacitor when detecting an abnormal operation state of the comparator; and
   an analog-digital conversion logic circuit configured to control a second end of the third capacitor and a second end of the fourth capacitor to output a digital value in a state where the offset voltage correction section applies the offset voltage to the first capacitor and the second capacitor.

5. The analog-digital conversion circuit according to claim 4, wherein
   the comparator is a dynamic latch comparator,
   the first switch, the second switch, and the comparator are controlled by control signals, the control signals having an operation timing common to one another, and
   the offset voltage correction section connects the second end of the first capacitor and the second end of the second capacitor to a ground node when the first switch and the second switch are turned on, and applies the offset voltage to the second end of the first capacitor and the second end of the second capacitor when the first switch and the second switch are turned off.

6. The analog-digital conversion circuit according to claim 5, wherein
   the first capacitor and the third capacitor each include a plurality of capacitors each having a first end connected to the non-inverting input terminal, and the second capacitor and the fourth capacitor each include a plurality of capacitors each having a first end connected to the inverting input terminal,
   the offset voltage correction section applies a predetermined voltage to a second end of a capacitor selected from the plurality of capacitors included in the first capacitor and to a second end of a capacitor selected from the plurality of capacitors included in the second capacitor, and
   the analog-digital conversion logic circuit controls a connection state of the plurality of capacitors included in the third capacitor and a connection state of the plurality of capacitors included in the fourth capacitor, to determine a digital value to be output.

* * * * *